(12) United States Patent
Tamboli et al.

(10) Patent No.: US 8,053,264 B2
(45) Date of Patent: Nov. 8, 2011

(54) PHOTOELECTROCHEMICAL ETCHING OF P-TYPE SEMICONDUCTOR HETEROSTRUCTURES

(75) Inventors: Adele Tamboli, Pasadena, CA (US);
Evelyn Lynn Hu, Cambridge, CA (US);
Mathew C. Schmidt, Santa Barbara, CA (US); Shuji Nakamura, Santa Barbara, CA (US); Steven P. DenBaars, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 50 days.

(21) Appl. No.: 12/464,723

(22) Filed: May 12, 2009

(65) Prior Publication Data

US 2009/0283800 A1    Nov. 19, 2009

Related U.S. Application Data

(60) Provisional application No. 61/052,421, filed on May 12, 2008.

(51) Int. Cl.
*H01L 21/3213* (2006.01)
(52) U.S. Cl. ...... 438/47; 438/94; 438/746; 257/E21.217
(58) Field of Classification Search ............ 438/47, 438/94, 746; 257/E21.217
See application file for complete search history.

(56) References Cited

U.S. PATENT DOCUMENTS 4,369,099 A * 1/1983 Kohl et al. ............... 205/646
5,773,369 A   6/1998 Hu et al.
5,824,206 A * 10/1998 Quinlan ................... 205/646
7,704,763 B2 * 4/2010 Fujii et al. ............... 438/29
2008/0182420 A1 * 7/2008 Hu et al. ................. 438/712
2009/0283800 A1 * 11/2009 Im et al. ................. 257/183
2009/0315055 A1 * 12/2009 Tamboli et al. ............ 257/98
2010/0025717 A1 * 2/2010 Fujii et al. ................ 257/98
2010/0072518 A1 * 3/2010 Shen et al. ............... 257/197
2010/0090240 A1 * 4/2010 Tamboli et al. ............ 257/98
2010/0195684 A1 * 8/2010 Tamboli et al. ......... 372/44.01
2010/0317132 A1 * 12/2010 Rogers et al. ............ 438/27

OTHER PUBLICATIONS

International Search Report, International application No. PCT/US09/43643, International filing date May 12, 2009.
Dorogan et al., "Photoelectrochemical etching of GaN-AlGaN heterostructures formed on sapphire substrates," Moldavian Journal of the Physical Sciences, N2, 2002, pp. 156-159.
Hwang et al., "Efficient wet etching of GaN and p-GaN assisted with chopped UV source," Superlattices and Microstructures, vol. 35, 2004, pp. 45-57.
Borton et al., "Bias-assisted photoelectrochemical etching of p-GaN at 300 K," Applied Physics Letters, vol. 77 (8) p. 1227 (2000).

(Continued)

Primary Examiner — George Fourson, III
(74) Attorney, Agent, or Firm — Gates & Cooper LLP

(57) ABSTRACT

A method for photoelectrochemical (PEC) etching of a p-type semiconductor layer simply and efficiently, by providing a driving force for holes to move towards a surface of a p-type cap layer to be etched, wherein the p-type cap layer is on a heterostructure and the heterostructure provides the driving force from an internal bias generated internally in the heterostructure; generating electron-hole pairs in a separate area of the heterostructure than the surface to be etched; and using an etchant solution to etch the surface of the p-type layer.

17 Claims, 8 Drawing Sheets

OTHER PUBLICATIONS

Yang et al., "Photoenhanced electrochemical etching for p-GaN," Electronics Letters 36, No. 1, p. 88 (2000).

Stocker et al., "Crystallographic wet chemical etching of p-type GaN," Journal of the Electrochemical Society 147 (2), p. 763 (2000).

Na et al., "Selective wet etching of p-GaN for efficient GaN-based light emitting diodes," IEEE Photonics Technology Letters 18, No. 14, p. 1512 (2006).

Podlesnik et al., "Deep ultraviolet induced wet etching of GaAs," Applied Physics Letters 45 (5), p. 563 (1984).

Van De Ven et al., "Photo-assisted etching of p-type semiconductors," Journal Electrochemical Society, vol. 138, No. 11, p. 3401 (1991).

Fujii et. al., "Increase in the extraction efficiency of GaN-based light-emitting diodes via surface roughening", Appl. Phys. Lett. 84 (2004).

* cited by examiner

PHOTOELECTROCHEMICAL ETCHING OF P-TYPE SEMICONDUCTOR HETEROSTRUCTURES

CROSS REFERENCE TO RELATED APPLICATIONS

This application claims the benefit under 35 U.S.C. Section 119(e) of co-pending and commonly-assigned U.S. Provisional Patent Application Ser. No. 61/052,421, filed on May 12, 2008, by Adele Tamboli, Evelyn L. Hu, Mathew C. Schmidt, Shuji Nakamura, and Steven P. DenBaars, entitled "PHOTOELECTROCHEMICAL ETCHING OF P-TYPE SEMICONDUCTOR HETEROSTRUCTURES,";

which application is incorporated by reference herein.

This application is related to the following co-pending and commonly-assigned U.S. patent applications:

U.S. Utility application Ser. No. 10/581,940, filed on Jun. 7, 2006, by Tetsuo Fujii, Yan Gao, Evelyn L. Hu, and Shuji Nakamura, entitled "HIGHLY EFFICIENT GALLIUM NITRIDE BASED LIGHT EMITTING DIODES VIA SURFACE ROUGHENING,", now U.S. Pat. No. 7,704,763, issued Apr. 27, 2010, which application claims the benefit under 35 U.S.C Section 365(c) of PCT Application Serial No. US2003/039211, filed on Dec. 9, 2003, by Tetsuo Fujii, Yan Gao, Evelyn L. Hu, and Shuji Nakamura, entitled "HIGHLY EFFICIENT GALLIUM NITRIDE BASED LIGHT EMITTING DIODES VIA SURFACE ROUGHENING,";

U.S. Utility application Ser. No. 12/464,711, filed on May 12, 2009, by Adele Tamboli, Evelyn L. Hu, Steven P. DenBaars and Shuji Nakamura, entitled "PHOTOELECTROCHEMICAL ROUGHENING OF P-SIDE-UP GaN-BASED LIGHT EMITTING DIODES,", which application claims the benefit under 35 U.S.C. Section 119(e) of U.S. Provisional Application Ser. No. 61/052,417, filed on May 12, 2008, by Adele Tamboli, Evelyn L. Hu, Steven P. DenBaars, and Shuji Nakamura, entitled "PHOTOELECTROCHEMICAL ROUGHENING OF Ga-FACE, P-SIDE-UP GaN BASED LIGHT EMITTING DIODES,"; and U.S. Provisional Application Ser. No. 61/104,015, filed on Oct. 9, 2008, by Adele Tamboli, Evelyn L. Hu, and James S. Speck, entitled "PHOTOELECTROCHEMICAL ETCHING FOR CHIP SHAPING OF LIGHT EMITTING DIODES,"; and U.S. Provisional Application Ser. No. 61/148,679, filed on Jan. 30, 2009, by Adele Tamboli, Evelyn L. Hu, Arpan Chakraborty, and Steven P. DenBaars, entitled "PHOTOELECTROCHEMICAL ETCHING FOR LASER FACETS,";

which applications are incorporated by reference herein.

BACKGROUND OF THE INVENTION

1. Field of the Invention

This invention relates to roughening of p-type GaN layers and a photoelectrochemical method for etching and roughening p-type GaN layers.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

Photoelectrochemical (PEC) wet etching has been applied to a variety of semiconductors, including GaAs, InP, and GaN. For GaN especially, PEC etching has been of great interest since there are very limited alternatives for room temperature wet etching.

FIG. 1 illustrates a PEC etching setup according to the present invention which includes a light source (e.g., abovebandgap 1000 Watt Xe lamp 100) and an electrochemical cell, where the semiconductor (of the e.g., GaN Light Emitting Diode (LED) sample 102) acts as the anode of the system and has metal 104 (usually platinum) patterned directly on it to act as the cathode. Light 106 generates electron-hole pairs in the semiconductor, and electrons are extracted through the cathode, while holes participate in oxidation reactions at the semiconductor surface, causing the semiconductor surface to be dissolved in an electrolyte 108. Because of the surface band bending at the semiconductor/electrolyte interface, holes are typically confined at the surface in n-type materials only, while electrons are confined at the surface in p-type materials. In addition, accumulation of photogenerated electrons at the p-type semiconductor surface constrains the etching of that material. Thus, PEC etching of p-type semiconductors has been difficult to achieve. The light 106 from the light source 100 may be filtered, for example, by a GaN filter 110, the metal 104 may be an opaque metal (e.g., Ti and Pt) mask, acting as the cathode, and the electrolyte solution 108 may be a 5 molar (M) potassium hydroxide (KOH) solution, for example. The p-GaN of the LED 102 is the anode for the PEC etching and the electrolyte 108 is in a container 112.

PEC etching is a well-established process used for n-type and unintentionally doped semiconductors, but it has had very limited success for etching p-type layers. There have been limited reports of PEC etching of p-type semiconductors in the past, but they have generally required elevated temperatures, a substantial external bias on the system, or a complex experimental apparatus. In addition, etch rates are generally very slow compared to n-type materials.

Several groups have used the application of a substantial external bias to p-type samples to achieve PEC etching of p-type semiconductors [1], [2]. Either a very large bias is necessary or the etch rate is very slow. Both of these groups used GaN. In the case of Borton et al. [1], a high-temperature KOH soak was necessary before etching, and then etching occurred under a small (~2V) bias, resulting in etch rates on the order of 1-5 nm/minute and very rough morphology. Yang et al. [2] achieved higher etch rates (2 μm/minute) but had to apply an external bias of 10 V. Hwang et al. [3] used a chopped ultraviolet (UV) light source to achieve electrode-less etching of p-type GaN. They were able to obtain an etch rate of 2.8 nm/minute using this technique, but at the cost of increased roughness compared to similar etch conditions for n-type GaN.

Several groups have reported on the use of KOH/ethylene glycol mixtures to etch p-GaN in a purely chemical manner. However, this etch is very crystallographically selective, and also requires the use of quite elevated temperatures. The etch described in Na [5] requires a temperature of 165° C.

Deep UV irradation has been used for PEC etching of p-type GaAs [6]. This technique relies on the fact that the penetration depth of deep UV is very short in GaAs, and thus very high energy holes are generated close to the surface, are injected into the interface between the semiconductor and the electrolyte, and can participate in etching reactions there.

A two-compartment electrochemical cell has been used to PEC etch bulk p-GaAs [7]. In this case, the use of a basic solution on one side of the wafer and an acid solution on the other side of the wafer provides a driving force for holes to move towards the basic side. Light is incident on the acidic side so that electrons are confined there, while photogenerated holes diffuse to the basic side, driven by the difference in surface bandbending on the two sides, and participate in etching on the basic side in the absence of electrons. While feasible for fundamental studies of etching, this two-compartment geometry does not easily accommodate the practical etching of GaN devices.

Thus, there is a need in the art for improved processes for PEC etching p-type semiconductors. The present invention satisfies this need.

SUMMARY OF THE INVENTION

To overcome the limitations in the prior art described above, and to overcome other limitations that will become apparent upon reading and understanding the present specification, the present invention describes etching (e.g., wet etching, PEC etching) of p-type semiconductors simply and efficiently through the use of heterostructures.

More specifically, the present invention discloses a method for etching a p-type semiconductor layer in a device structure, comprising etching the p-type layer using an internal electric field of the device structure. The internal electric field can be used to drive holes to a surface of the p-type layer being etched. The method may further comprise generating electron-hole pairs in a separate area of the device structure than a surface of the p-type layer being etched, wherein the internal electric field provides a driving force for holes to move towards the surface, rather than a bulk, of the p-type layer. Generation occurs via illumination by a light source, with the wavelength chosen so that light is only absorbed in an area of the device where the internal electric field is located.

As noted above, the device structure is typically a heterostructure and the internal electric field is a result of doping in the structure.

The present invention allows for no substantial external bias to be applied to the p-type layer in order to etch the p-type layer. If an external bias is used, the internal electric field is typically stronger, thereby bringing holes to a surface of the p-type semiconductor layer faster, as compared to an electric field produced by an external bias applied to the device structure in order to etch the p-type layer. The internal electric field enables etching the p-type semiconductor layer at a rate comparable to an etch rate of an n-type semiconductor layer. The etch rate can be at least 2.8 nm per minute, using an external bias is less than 2 Volts, and the etching can produce a surface roughness of the p-type layer as smooth as a surface roughness of an n-type semiconductor layer etched under substantially similar conditions.

The etching of the p-type layer can be in an electrolyte at room temperature, or, for example, in an electrolyte at a temperature lower than a temperature used in a purely chemical wet etch of the p-type layer, or at the temperature lower than a temperature used in an etch of the p-type layer that uses an external bias.

The present invention enables etching of the p-type layer to obtain surfaces that are not crystallographic planes, and can be either anisotropic or isotropic trenches in the p-type layer. The etching can be with bandgap selectivity, defect selectivity, or both.

The present invention may comprise doping, or introducing strain into, the device structure to create the internal electric field that drives holes to a location of the device structure being etched.

The present invention further discloses a heterostructure, comprising a p-type semiconductor having an etched surface, wherein damage to the p-type semiconductor etched by PEC is lower as compared to a p-type semiconductor etched by ion-assisted plasma etching or dry etching. For example, the PEC etching may not introduce any damage to the p-type semiconductor. The heterostructure may comprise an etched surface that is not a crystallographic plane of the p-type semiconductor, one or more anisotropic trenches in the p-type semiconductor, and/or a smoothness or roughness comparable to an etched surface of an n-type semiconductor.

BRIEF DESCRIPTION OF THE DRAWINGS

Referring now to the drawings in which like reference numbers represent corresponding parts throughout:

FIG. 7(c) is a cross-sectional schematic of a p-type GaN/InGaN/n-type GaN junction sample, and FIG. 7(d) is an optical microscope image of the top surface of the sample of FIG. 7(c) after etching (length scale 500 μm), wherein the darker regions in FIG. 7(d) indicate etching as compared to lighter regions (no etching) in FIG. 7(b).

DETAILED DESCRIPTION OF THE INVENTION

Figure 1:
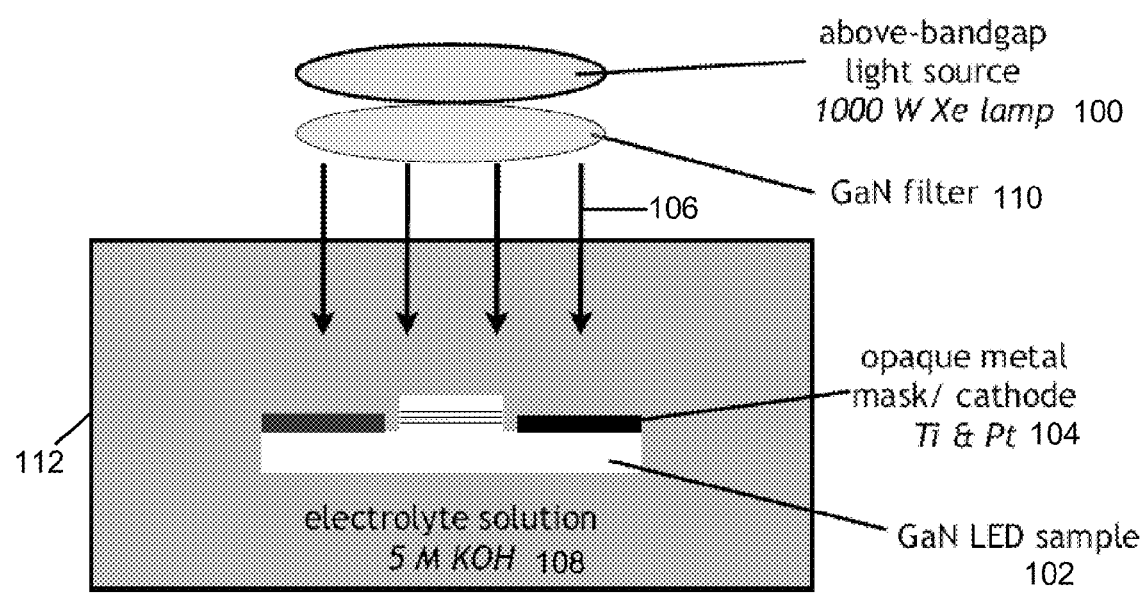
FIG. 1 is a PEC etching schematic, illustrating a PEC etching apparatus.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

There have been limited reports of PEC etching of p-type semiconductors in the past, and they have generally required elevated temperatures, a substantial external bias on the system, or a complex experimental apparatus. In addition, etch rates are generally very slow compared to n-type materials.

The key requirements are: (a) there must be a driving force for holes to move towards the surface, rather than the bulk, of the p-type layer, and (b) electron-hole pairs must be generated in a separate area of the structure than the surface to be etched.

For example, using a standard LED structure, a light source can be chosen that is absorbed only in the quantum well region, and the doping of the structure spatially separates the photogenerated carriers such that electrons are pulled into the n-type layer, where they can escape through the cathode, and holes are pulled into the p-type cap layer. If a strongly basic solution such as KOH is used as an electrolyte, the photogenerated holes can make it to the surface to participate in etching reactions. In this way, the p-type surface of a heterostructure can be etched without the need for dry etching.

The ability to etch p-type semiconductor materials through a PEC wet etch process opens up the possibility for a wide range of device fabrication processes requiring etching of p-type material. The wet etch nature of the process provides the capability for rapid, low-damage etching, compared to ion-assisted plasma etching techniques. Additionally, PEC etching provides many advantages over traditional etching techniques, such as the ability to form deep, anisotropic trenches, bandgap selectivity, and defect selectivity.

Technical Description

Without being bound by a specific scientific principle or theory, the present invention discloses that it is possible to achieve etching (e.g., PEC etching) of p-type semiconductors simply and efficiently through the use of heterostructures. Since heterostructures naturally form the basis of most device structures, the etching can be simply implemented. The key requirements are: (a) there must be a driving force for holes to move towards the surface, rather than the bulk, of the p-type layer, and (b) electron-hole pairs must be primarily generated in a separate area of the structure than the surface to be etched. A broadband (unfiltered) light source may also be used, because more electron-hole pairs are generated in the low-bandgap layers than the p-type layers even though some electron-hole pairs are generated in the p-type layers as well (the etch rate will be slower in this case, however).

Figures 2A, 2B:
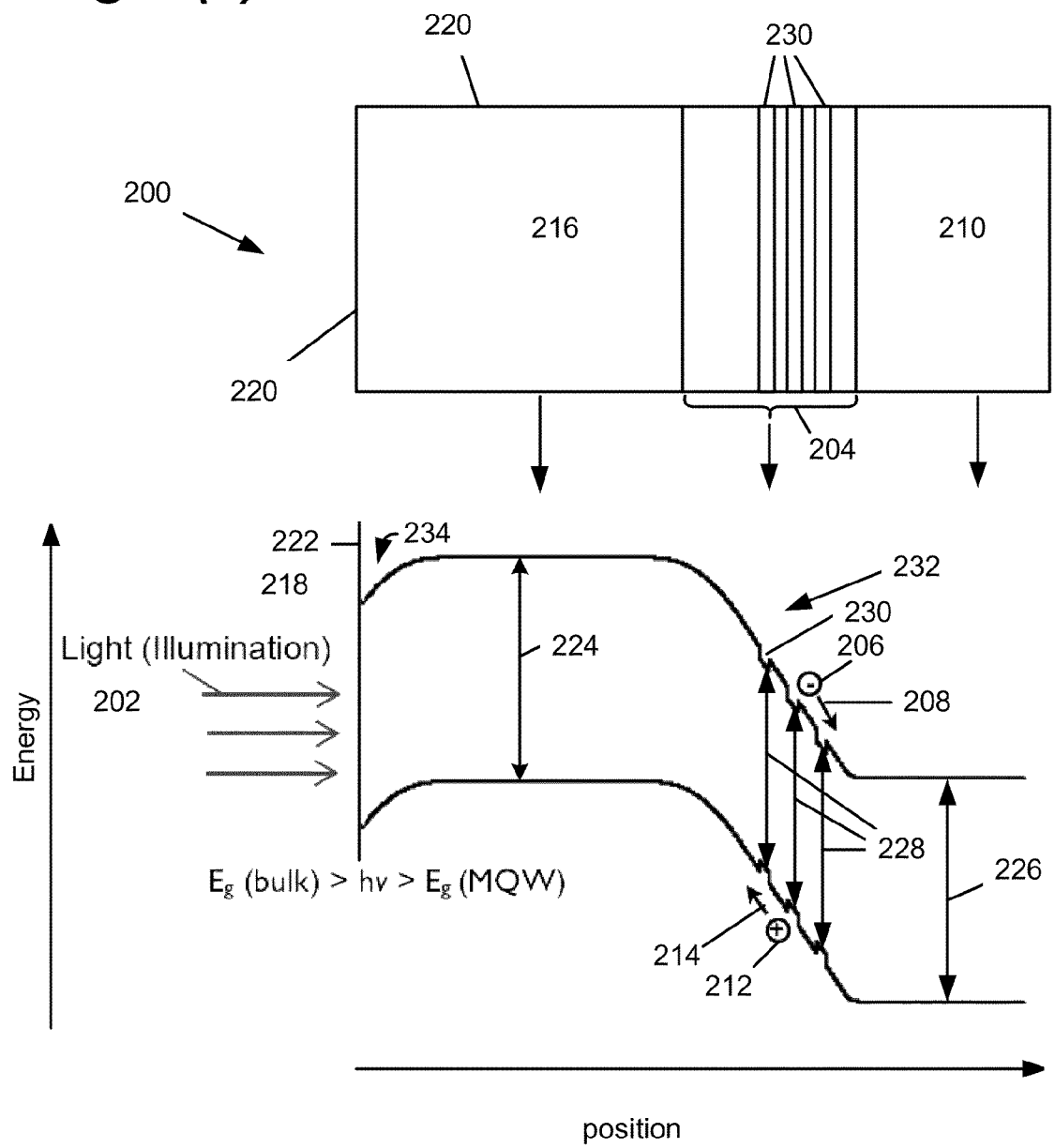
FIG. 2(a) is a cross-sectional schematic of a p-i-n heterostructure.
FIG. 2(b) is a schematic energy band diagram at the surface of the p-type layer of the LED and as a function of position through the layers of the structure in FIG. 2(a), showing carrier pathways in the LED/electrolyte system.

For example, using a standard LED structure 200, a light source can be chosen that emits light 202 that is absorbed mainly in the quantum well region 204, and the doping of the structure 200 spatially separates the photogenerated carriers such that electrons 206 are pulled 208 into the n-type layer 210, where they can escape through the cathode, and holes 212 are pulled 214 into the p-type cap layer 216 (FIG. 2(a) and FIG. 2(b)). If a strongly basic solution such as KOH is used as an electrolyte 218, the photogenerated holes 212 can make it to the surface 220 (e.g., any interface 222 of the p-type layer 216 with the electrolyte 218) to participate in etching reactions. In this way, the p-type surface 220 of a heterostructure 200 can be etched without the need for dry etching. The bandgap $E_g$(bulk) 224, 226 of the bulk 216, 210, is greater than the bandgap $E_g$(MQW) 228 of the quantum wells 230 (e.g., MQWs) so that the light 202 of photon energy hv (where h is Planck's constant and v is the frequency of the light 202) is only absorbed in the quantum wells 230 of the quantum well region 204.

The best way to achieve p-type PEC etching is to use a p-i-n structure 200 in which there is a low-bandgap layer 230 in the intrinsic region 204. Light is filtered 110 such that electron-hole pairs are generated in the low-bandgap layer 230, and they are separated by the built-in fields of the p-n junction 200, wherein the built-in-fields are proportional to the slope 232 of conduction band $E_c$ and valence band $E_v$ between the p-type region 216 and n-type region 210. A high-pH electrolyte 218 should be used, such as KOH, to flatten the bands 234 at the surface 220 (or interface 222), and very intense light 202, such as a 1000 W Xe lamp 100, should be used to create a sufficient number of carriers 206, 212 so that some carriers 212 will overcome the remaining band bending of the bands 234 at the p-GaN surface 220. Other heterostructures would work as long as they satisfy criteria mentioned above. The band diagrams would need to be evaluated in each case. Other light sources 100 of sufficient brightness would work (e.g. a laser) and other electrolytes (e.g. acids) 218 would work.

In PEC etching, photo-generated holes are used to drive the etch process. In traditional top down illumination of p-GaN, holes are driven away from the surface and electrons accumulate at the surface, favoring undesired reduction reactions and hole recombination. FIG. 2(a) and FIG. 2(b) illustrate that the present invention photo-generates carriers (electrons 206 and holes 212) as usual, but directs the electrons 206 away from the surface 220 and guides the holes 212 to the surface 220 or interface 222. The power of heterostructures 200 and bandgap engineering create electrons 206 and holes 212 sub-surface, use a built in electric field 232 to separate electrons 206 from holes 212, so that holes 212 are at the surface 220 and electrons 206 are deep in the material 200.

Figure 3:
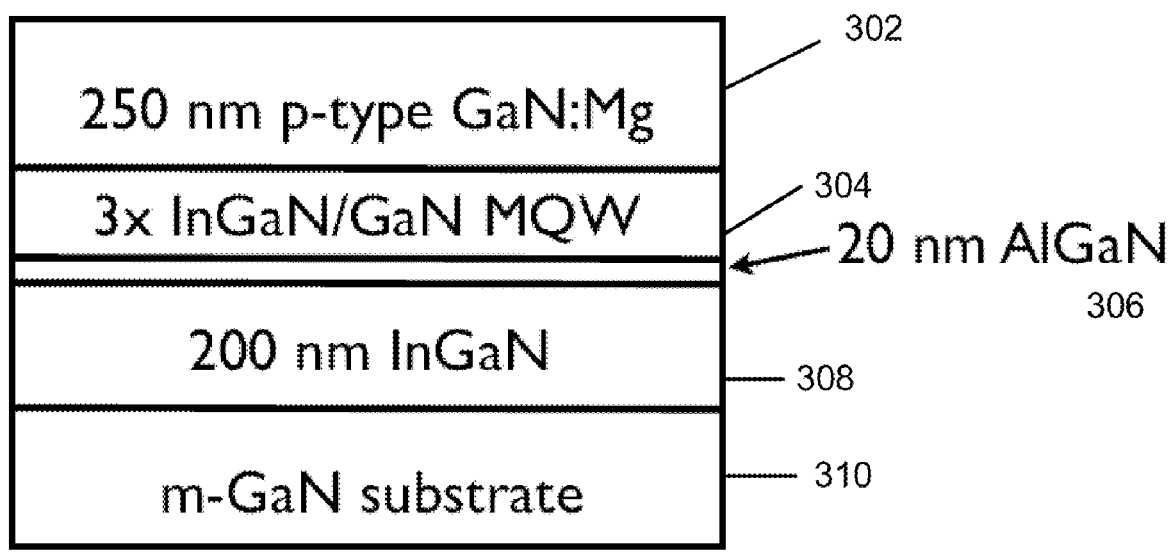
FIG. 3 is a cross-sectional schematic of an epitaxial structure of a heterostructure before PEC etching, comprising a 250 nanometer (nm) thick p-type GaN layer (doped with Mg), a 3 period InGaN/GaN multi quantum well (MQW), a 20 nm thick AlGaN layer, a 200 nm thick InGaN layer, and an m-plane GaN substrate, wherein after etching, the top p-GaN layer is gone.
Figure 4:
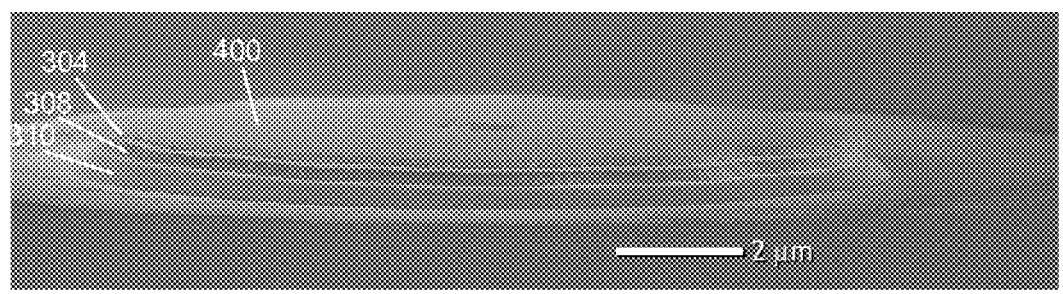
FIG. 4 is a scanning electron micrograph (SEM) image of the structure of FIG. 3, with the top p-GaN etched off by PEC etching, wherein the SEM reveals a smooth, uniform etched surface, and the scale is 2 micrometers (μm).

The present invention has demonstrated that low concentration HCl works as well as KOH, and a lower intensity LED-based lamp, as well as unfiltered illumination from a 1000 W Xe lamp, produce the same effect (FIGS. 3-4).

FIG. 3 is a schematic of an epitaxial structure of a heterostructure 300 before PEC etching, comprising a p-type layer 302 (e.g., 250 nm thick p-type GaN layer, doped with Mg), an intrinsic layer 304 (e.g., 3 period InGaN/GaN MQW), a 20 nm thick AlGaN layer 306, an InGaN layer 308 (e.g., 200 nm thick InGaN), and an m-plane GaN substrate 310. Both layer 308 and layer 310 are doped n-type. The cathode is placed in contact with layer 310.

FIG. 4 is an SEM image of the structure of FIG. 3, after etching using the present invention, with the top p-GaN 302 etched off by PEC etching, wherein the SEM reveals a smooth, uniform etched surface 400 of the intrinsic layer 304. Also shown is the InGaN layer 308 and m-plane GaN substrate 310.

Figure 5:
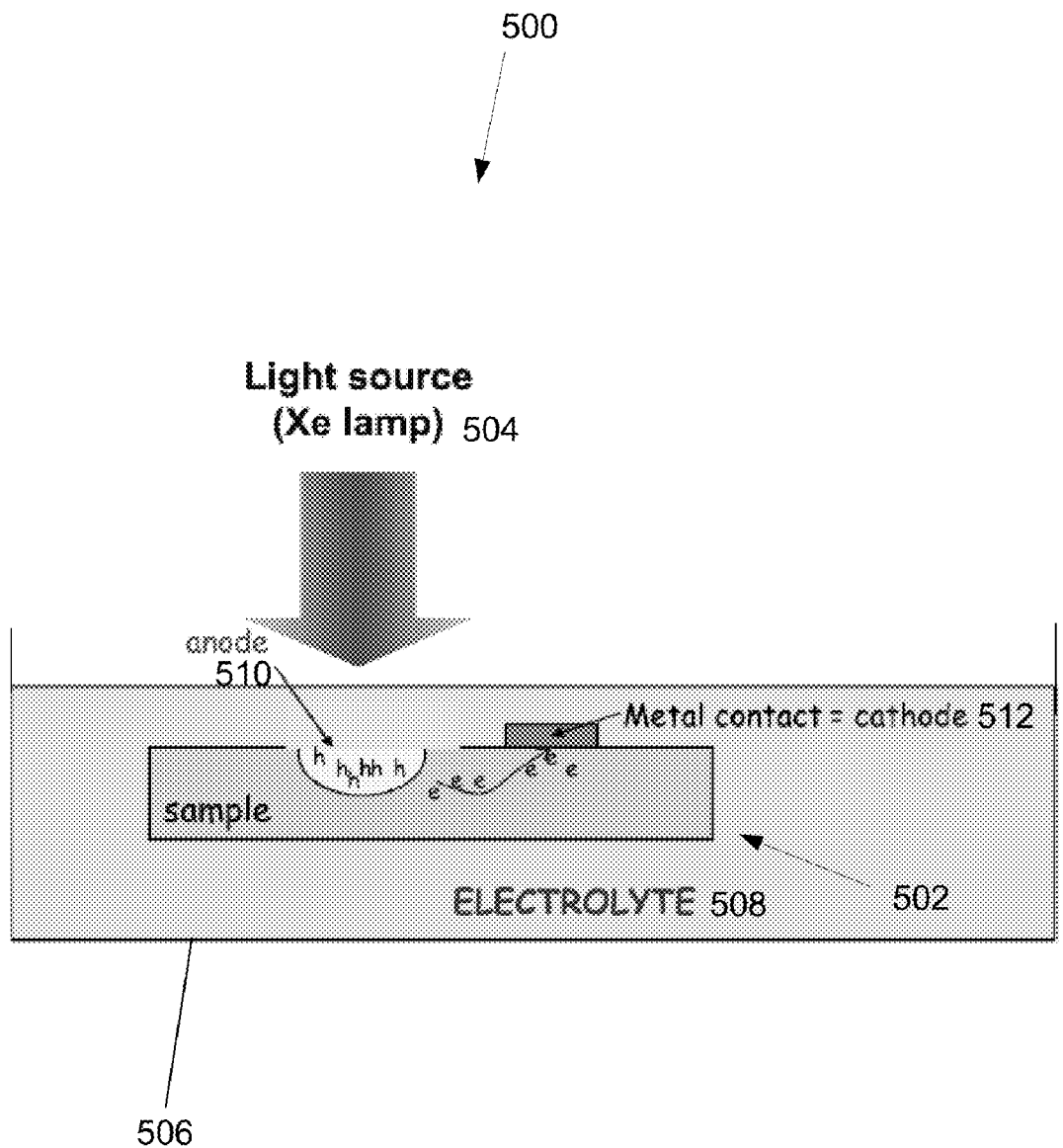
FIG. 5 is a cross-sectional schematic of a PEC apparatus for etching a sample.

FIG. 5 illustrates an embodiment of an apparatus 500 for PEC etching of an n-type sample 502, comprising a light source 504; and a container 506 for immersing the sample 502 in an electrolytic solution or electrolyte 508. The electrolyte (etchant) 508 has a low (e.g., zero) etch rate without the light source 504. Photogenerated holes h in the anode 510 enhance oxidation (etching), and electrons e, which participate in reduction reactions, are extracted by metal contacts, e.g., cathode 512.

The common wisdom for PEC etching of any semiconductor is that n-type material can etch rapidly, unintentionally doped (UID) material etches quite slowly, and p-type material does not etch at all.

Figure 6A:
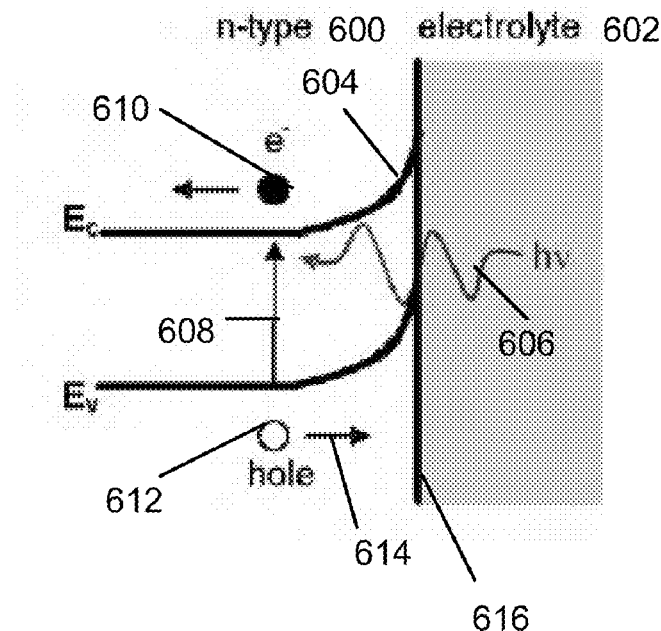
FIG. 6(a) is a band diagram of the interface between n-type material and an electrolyte.

FIG. 6(a) illustrates the band diagram at the interface of n-type material 600 (e.g., n-type GaN) and an electrolyte 602, showing the effect of band-bending 604 of the $E_c$ and $E_v$ of the n-type material 600, wherein incident light 606 having a photon energy hv at least equal to the bandgap energy ($E_C$-$E_V$) generates 608 electrons ($e^-$) 610 and holes 612, the holes 612 are confined or driven 614 by band-bending 604 to the semiconductor-electrolyte interface 616, thereby enabling enhanced use of photo-generated holes 612 for oxidation/etching of the n-type material 600.

Figure 6B:
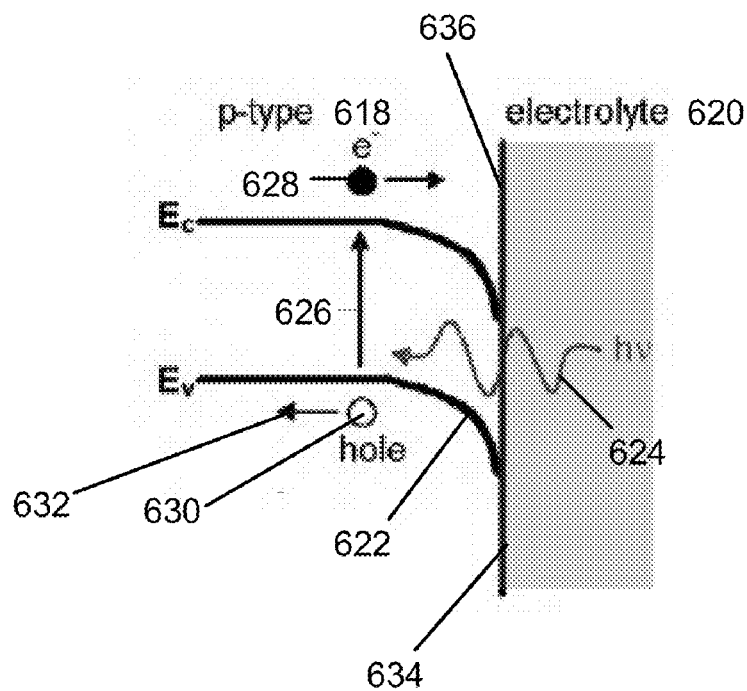
FIG. 6(b) is a band diagram of the interface between p-type material and an electrolyte.

FIG. 6(b) illustrates the band diagram at the interface of p-type material 618 (e.g., p-type GaN) and an electrolyte 620, showing the effect of band-bending 622 of $E_c$ and $E_v$ of the p-type material 618, wherein incident light 624 having an energy hv at least equal to the bandgap energy ($E_C$-$E_V$) generates 626 electrons 628 and holes 630, the holes 630 are pushed away 632 from the semiconductor-electrolyte interface 634 by the band-bending 622, and electrons 628 at the surface 636 or interface 634 of the p-type material 618 participate in reduction chemistry or recombination with holes 630, which is undesired.

Figure 7A:
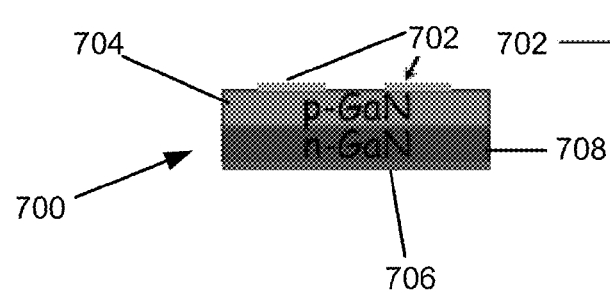
FIG. 7(a) is a cross-sectional schematic of a p-n junction sample.
Figure 7B:
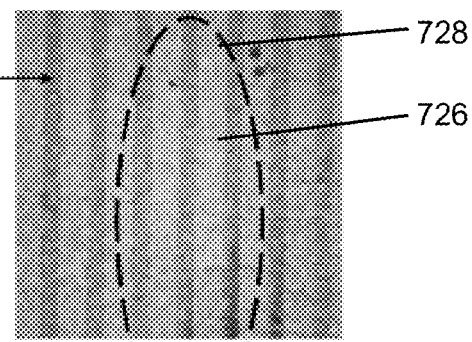
FIG. 7(b) is an optical microscope image of the top surface of the sample of FIG. 7(a) after performing an etching process (length scale 500 μm)
Figure 7B:
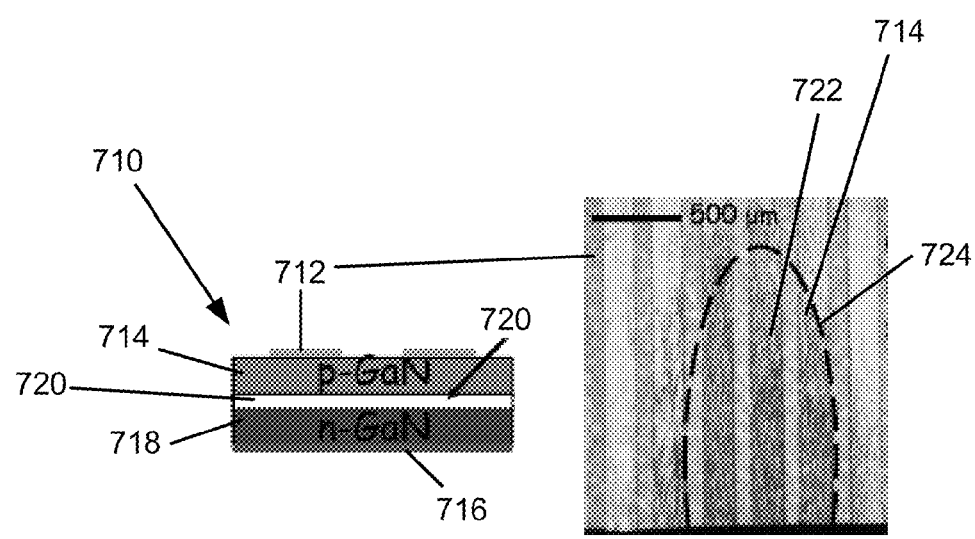

FIG. 7(a) illustrates a p-n junction sample 700, with a silicon nitride ($SiN_x$) mask 702 on the p-type GaN (p-GaN) layer 704 and Ti/Pt cathode 706 on the n-type GaN (n-GaN) layer 708 of the sample 700. The sample 700 was etched in the presence of an electrolyte (e.g., 5 M KOH electrolyte) and light (e.g., from a 1000 W Xe lamp) that is filtered to only excite carriers in InGaN (e.g., using a GaN filter). FIG. 7(b) is an optical microscope image of the top surface of the sample 700 in FIG. 7(a) after etching, showing that the p-GaN 704 has substantially not etched.

FIG. 7(c) illustrates a p-GaN/InGaN quantum well/n-GaN sample 710, with a $SiN_x$ mask 712 on a p-type GaN layer 714 and Ti/Pt cathode 716 on the n-type GaN layer 718. An InGaN quantum well layer 720 is between the p-GaN layer 714 and n-GaN layer 718. The sample 710 was etched in the presence of an electrolyte (e.g., 5 M KOH electrolyte) and light (e.g., from a 1000 W Xe lamp) that is filtered to only excite carriers in InGaN 720 (e.g., using a GaN filter). FIG. 7(d) is an optical microscope image of the top surface of the sample 710 in FIG. 7(c) after etching, showing that the p-GaN 714 has etched (surface 722 of p-GaN 714 within dotted circle oval 724). The darker colored surface 722 in FIG. 7(d) indicates etching of p-GaN 714, as compared to the lighter colored surface 726 (of p-GaN 704) within the dotted oval 728 which indicates no etching of p-GaN 704 in FIG. 7(b). In addition, with filtered light, only the InGaN sample 710 etched, however, with unfiltered light (generating carriers in GaN 704, 708, 714, and 718) the InGaN sample 710 etched at a reduced rate.

FIG. 1, FIG. 2(a), FIG. 2(b), and FIG. 7(c) illustrate various examples of an apparatus for PEC etching of a p-type layer 714 of a heterostructure 200, 710, comprising a light source 100; and a container 112 for immersing the heterostructure 200, 710 in an electrolytic solution 108 (or other means for providing an electrolyte 218, on the surface 220 of the p-type layer 216, or allowing the surface 220 to participate in etching reactions with an electrolyte 218), wherein the heterostructure 200, 710 is comprised of an intrinsic layer 204, 720 between the p-type layer 216, 714 and an n-type layer 210, 718, the heterostructure 200, 710 is e.g., doped to generate an internal bias or field 232, the intrinsic layer 204, 720 absorbs light 202 emitted from the light source to generate electrons 206 and holes 212, and the electrons 206 are driven by the internal bias or field 232 into the n-type layer 210, 718 for extraction by a cathode 716 placed on the n-type layer 718, and the holes 212 are driven by the internal bias or field 232 to a surface 220, 722 of the p-type layer 216, 714 to participate in etching reactions with the electrolytic solution 218 on the surface 220, 722 of the p-type layer 216, 714.

Process Steps

Figure 8:
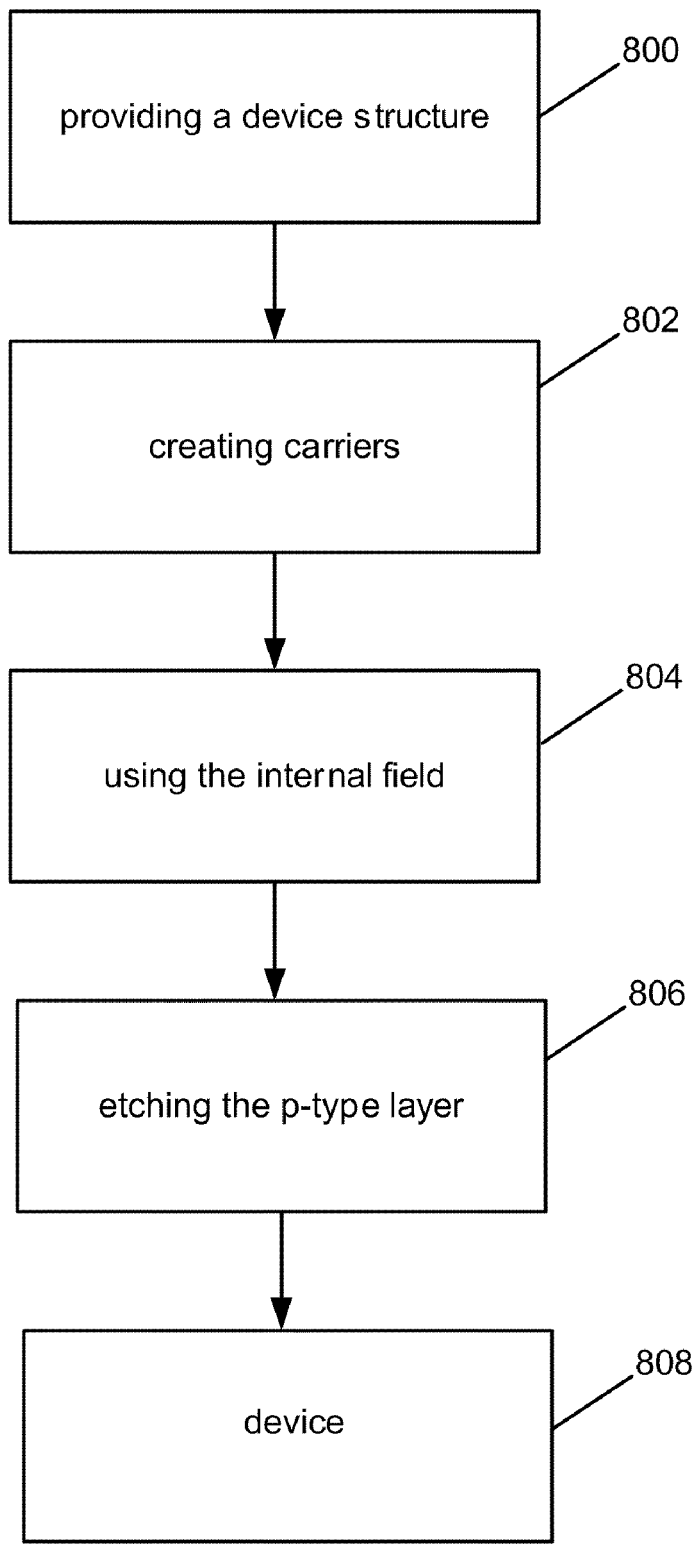
FIG. 8 is a flowchart illustrating a method of the present invention.

FIG. 8 is a flowchart illustrating a method for etching a p-type semiconductor layer in a device structure, for example, as illustrated in FIGS. 2(a) and 2(b), and FIGS. 7(a)-7(d).

The method may comprise one or more of the following steps:

Block 800 represents providing or creating a device structure (for example, the device structure 200 shown in FIGS. 2(a) and 2(b)) with an internal electric field 232, thereby providing a driving force for holes 212, wherein the internal electric field 232 or driving force can be used to drive, bring or sweep holes 212 to or towards a surface (or location) of the p-type layer 216 to be etched by the etching. Typically, the p-type layer 216 is part of a device structure such as a heterostructure 200. The heterostructure 200 may then provide the driving force from the internal electric field 232 or bias generated internally inside the heterostructure 200. The heterostructure may comprise an intrinsic layer 204 (e.g., quantum well region) positioned between a p-type layer 216 and an n-type layer 210, an LED device structure, or a transistor structure, for example. The intrinsic layer 204, and quantum wells 230, may be the light emitting active region of an LED, for example.

The method may comprise doping the device structure, or introducing strain into the device structure, to create the internal electric field that drives holes to a location of the device structure to be etched. Typically, however, the internal electric field is not created by a depletion field.

Block 802 represents creating/generating carriers (electrons and holes, or electron-hole pairs) in a separate area of the device structure than the surface of the p-type layer to be etched (e.g., sub-surface, or inside the device structure and away from the surface). The generating may be photo-generating the electron hole pairs with light from a light source, and selecting the light's frequency such that the light is only, or mainly, absorbed in the separate area of the device structure where the internal electric field is located. In one embodiment, the separate area is an intrinsic layer that absorbs light emitted from a light source to generate the electrons and holes, and the light source is selected to emit light that is absorbed only in the intrinsic region (e.g., quantum well region). For example, if the device heterostructure is an LED comprising an n-type layer, a p-type layer, and a quantum well active region that is a separate area of the heterostructure positioned between the n-type layer and the p-type layer, the carriers may be created by emitting light from a light source that is absorbed only in the quantum well region of the LED, thereby photogenerating the electrons and holes.

Block 804 represents using the internal or natural field to move the holes to a surface of the device to be etched. For example, the doping of the structure provides the internal electric field or bias that spatially separates the photogenerated electrons and holes of block 802, such that the photogenerated electrons are pulled into the n-type layer of the device structure, where they can escape through a cathode, and the photogenerated holes are pulled into the p-type cap layer, where they reach the surface of the p-type layer of the device structure to be etched. By appropriate design of the heterostructure/internal field, the internal can be used to bring carriers to anywhere that promotes etching (e.g., holes to the location that is to be etched, and electrons away from that location).

Block 806 represents etching (e.g., wet etching) the p-type layer using the internal electric field of the device structure, for example, by allowing the photogenerated holes that reach the surface to participate in etching reactions with an electrolyte.

Typically, the electrolyte is sufficiently basic to perform the etching. The p-type layer may be etched in an electrolyte at room temperature. For example, the etching of the p-type layer may be in an electrolyte at a temperature lower than a temperature used in a purely chemical wet etch (i.e. no PEC etching) of the p-type layer, or at the temperature lower than a temperature used in an etch of the p-type layer that uses an external bias. For example, the etching may be at ~300K or 25° C. Typically, wet etches of GaN occur at much higher temperatures, ~160° C.

The present invention allows for substantially no external bias applied to the p-type layer/heterostructure in order to etch the p-type layer. However, the present invention also includes the use of an external field. In this case, the internal electric field is typically stronger, thereby bringing holes to a surface of the p-type semiconductor layer faster, as compared to an electric field produced by an external bias applied to the device structure in order to etch the p-type layer.

The internal electric field enables etching the p-type semiconductor layer at a rate at least comparable to an etch rate of an n-type semiconductor material layer. For example, the etch rate may be at least 2.8 nm per minute, the external bias may be less than 2 V, and the etching may produce a surface roughness of the p-type layer at least as smooth as a surface roughness of an n-type semiconductor layer etched under substantially similar conditions.

The present invention may etch p-type III-nitride materials with various (Al,In,Ga,B)N compositions. For example, the p-type layer may be a GaN layer and the surface of the p-type layer that is etched may be a Ga-face of the GaN layer. However, the present invention is not limited to III-nitrides or any particular material composition. The p-type layer may be etched to obtain surfaces that are not crystallographic planes, and/or one or anisotropic trenches in the p-type layer. Furthermore, the p-type layer may be etched with bandgap selectivity, defect selectivity, or both bandgap selectivity and defect selectivity.

One or more of the steps in blocks 800-806 may be performed at room temperature, for example, however the present invention is not limited to particular temperatures.

Block 808 represents the end result of the method, a fabricated device structure, such as an LED structure, laser structure, or transistor structure. For example, the device may comprise the structure shown in FIGS. 7(a)-7(d) (e.g., III-nitride structure with layers of different (Al,In,Ga,B)N composition), comprising a p-type semiconductor 714 having an etched surface 722, wherein damage to the p-type semiconductor 714 etched by PEC etching is lower as compared to a p-type semiconductor etched by ion-assisted plasma etching or dry etching. PEC etching should not introduce any defects into the material. However, there are defects just from the growth, so the present invention's method does not increase the defect density at all with this method.

If desired, it is possible to achieve the etched surface 722 of the p-type semiconductor 714 that is not a crystallographic plane of the p-type semiconductor 714, and/or one or more anisotropic trenches in the p-type semiconductor layer 714.

It is also possible to achieve the etched surface 400 that has a smoothness or roughness comparable to an etched surface of an n-type semiconductor. In the case of etching the p-type surface top down without any sort of etch stop layer, the etch should be just as smooth as when etching n-type GaN in a similar method. In the case using an etch-stop layer, i.e., an undoped or n-type layer underneath the p-GaN, to stop the etch (as in FIG. 4), the resulting p-type surface will be just as smooth as the as-grown etch stop layer (as if the p-type had never been grown there).

Materials of different bandgap and with different defect levels may be etched by different amounts.

Possible Modifications and Variations

The primary advantage to using PEC etching compared to dry etching is the elimination of ion damage. The wet etch nature of the process provides the capability for rapid, low-damage etching, compared to ion-assisted plasma etching techniques. Additionally, because of PEC etching's bandgap and defect selective nature, it can be used to construct devices geometries that would not be possible with any other technique.

The ability to etch p-type semiconductor materials through a PEC wet etch process opens up the possibility for a wide range of device fabrication processes requiring etching of p-type material. Additionally, PEC etching provides many advantages over traditional etching techniques, such as the ability to form deep, anisotropic trenches, bandgap selectivity, and defect selectivity.

Any semiconductor device that requires etching of a p-type layer and meets the criteria stated above could use PEC etching. For example, most III-N optical devices require some form of etching, and PEC etching offers the advantage of introducing no ion damage to the material.

Other electrolytes, including acids, may work.

Advantages and Improvements

An important benefit to using PEC etching compared to dry etching is the removal of ion damage. This technique will improve performance of any devices that are particularly sensitive to ion damage, such as electronic and optical devices. Additionally, the selectivity that PEC etching allows may also lead to the development of completely new devices or fabrication processes. A further benefit is that this method for etching is much cheaper than a standard dry etch tool.

Compared to the other techniques of PEC etching of p-type semiconductors discussed above, the present invention's technique offers several advantages:

(1) It operates at room temperature and requires no external bias.
(2) Very smooth etched surfaces can be achieved, although the present invention is not limited to a particular surface quality (rough surfaces may be achieved as well, see for example, U.S. Utility application Ser. No. 12/464,711, filed on same date herewith, by Adele Tamboli, Evelyn L. Hu, Steven P. DenBaars and Shuji Nakamura, entitled "PHOTOELECTROCHEMICAL ROUGHENING OF Ga-FACE, P-SIDE-UP GaN-BASED LIGHT EMITTING DIODES,", which application claims the benefit under 35 U.S.C. Section 119(e) of U.S. Provisional Application Ser. No. 61/052,417, filed on May 12, 2008, by Adele Tamboli, Evelyn L. Hu, Steven P. DenBaars, and Shuji Nakamura, entitled "PHOTOELECTROCHEMICAL ROUGHENING OF Ga-FACE, P-SIDE-UP GaN BASED LIGHT EMITTING DIODES,", which applications are incorporated by reference herein). A factor that may determine whether a smooth or rough surface is achieved is the material used. Typically, the defects and crystallographic etching from using c-plane or some orientations of semipolar GaN lead to rough surfaces, while nonpolar or low defect density material typically yields smooth surfaces. There is some tunability based on which electrolyte is chosen, its concentration, the illumination intensity, and whether the solution is stirred during etching. For rough surfaces, concentrated KOH as an electrolyte with less intense illumination and no stirring may be used. Also, stopping the etch before reaching any etch-stop layers will ensure that the surface does not smooth out.
(3) The etching of heterostructures is both possible and straightforward.
(4) The experimental setup is simple and inexpensive.
(5) Ga-face GaN can be etched using this technique.

Some prior art techniques apply an external bias via a metal contact, so that the external bias pulls the surface energy down until the holes are below the surface to be etched. However, the metal contact in this technique covers most of the device surface, which is undesirable.

Other techniques use a high energy light source to make holes go to a small area of the surface to be etched, but this method is not efficient, and is also expensive.

Yet other techniques shine light periodically (on and off) to create carriers and allow carriers time to relax. In the present invention, shining the light periodically is not necessary.

Unlike the present invention, none of the prior art techniques have considered using the internal structure of the device to etch the p-type material. In addition, unlike the present invention, none of the prior art techniques have considered the correct frequency of light to photogenerate the electrons and holes to take advantage of the internal field in the heterostructure that promotes etching of the p-type layer.

In all the references [1-8] (except [5]), the p-type samples used were either just a p-type layer (no n-type layers) or were a p-n homojunction. None of these samples had a low-bandgap layer. Thus, there was no creation of excess holes in a low-bandgap layer. So these references [1-8] may have had a built-in field, but generation of carriers occurred at the surface rather than in a buried low-bandgap layer. In [5], they used a purely chemical method to etch defects, not PEC, so their technique is not comparable to the present invention.

Further information on the present invention can be found in [9].

REFERENCES

The following references are incorporated by reference herein.

[1] Borton et al., "Bias-assisted photoelectrochemical etching of p-GaN at 300 K," Applied Physics Letters, Vol. 77 (8) p. 1227 (2000).
[2] Yang et al., "Photoenhanced electrochemical etching for p-GaN," Electronics Letters 36, No. 1, p. 88 (2000).
[3] Hwang et al., "Efficient wet etching of GaN and p-GaN assisted with chopped UV source," Superlattices and Microstructures 35, p. 45 (2004).
[4] Stocker et al., "Crystallographic wet chemical etching of p-type GaN," Journal of the Electrochemical Society 147 (2), p. 763 (2000).
[5] Na et al., "Selective wet etching of p-GaN for efficient GaN-based light emitting diodes," IEEE Photonics Technology Letters 18, No. 14, p. 1512 (2006).
[6] Podlesnik et al., "Deep ultraviolet induced wet etching of GaAs," Applied Physics Letters 45 (5), p. 563 (1984).
[7] J. Van de Ven and H. J. P. Nabben, "Photo-assisted etching of p-type semiconductors," Journal Electrochemical Society, Vol. 138, No. 11, p. 3401 (1991).
[8] Fujii et. al. Appl. Phys. Lett. 84 (2004).
[9] Adele C. Tamboli, Asako Hirai, Shuji Nakamura, Steven P. DenBaars, and Evelyn Hu, "Photoelectrochemical etching of p-type GaN heterostructures," Applied Physics Letters 94, p 151113 (2009).
[10] Adele C. Tamboli, Kelly C. McGroddy, and Evelyn Hu, "Photoelectrochemical roughening of p-GaN for light extraction from GaN/InGaN light emitting diodes," physica status solidi, 27 Oct. 2008.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for etching a p-type semiconductor layer in a device structure, comprising:
   photo-electrochemical (PEC) etching the p-type layer of a p-i-n heterostructure using an internal electric field of the device structure and an electrolyte.

2. The method of claim 1, wherein the internal electric field drives holes to a surface of the p-type layer being etched.

3. The method of claim 1, further comprising generating electron-hole pairs in a separate area of the device structure than a surface of the p-type layer being etched, wherein the internal electric field provides a driving force for holes to move towards the surface, rather than a bulk, of the p-type layer.

4. The method of claim 3, further comprising photo-generating the electron hole pairs with light from a light source, and selecting the light's frequency such that the light is only absorbed in the separate area of the device structure where the internal electric field is located.

5. The method of claim 1, wherein the internal electric field is generated internally inside the heterostructure.

6. The method of claim 1, wherein substantially no external bias is applied to the p-type layer in order to etch the p-type layer.

7. The method of claim 1, wherein the internal electric field is stronger, thereby bringing holes to a surface of the p-type layer faster, as compared to an electric field produced by an external bias applied to the device structure in order to etch the p-type layer.

8. The method of claim 1, wherein the internal electric field enables etching the p-type layer at a rate at least comparable to an etch rate of an n-type layer.

9. The method of claim 8, wherein the etch rate is at least 2.8 nm per minute, an external bias is less than 2 Volts, and the etching produces a surface roughness of the p-type layer at least as smooth as a surface roughness of an n-type layer etched under substantially similar conditions.

10. The method of claim 1, further comprising etching the p-type layer in an electrolyte at room temperature.

11. The method of claim 1, further comprising etching the p-type layer in an electrolyte at a temperature lower than a temperature used in a chemical wet etch of the p-type layer, or at the temperature lower than a temperature used in an etch of the p-type layer that uses an external bias.

12. The method of claim 1, further comprising etching the p-type layer to obtain surfaces that are not crystallographic planes.

13. The method of claim 1, further comprising etching one or more anisotropic trenches in the p-type layer.

14. The method of claim 1, further comprising etching the p-type layer with bandgap selectivity, defect selectivity, or both bandgap selectivity and defect selectivity.

15. The method of claim 1, wherein the etching is wet etching.

16. The method of claim 1, further comprising doping the device structure to create the internal electric field that drives holes to a location of the device structure being etched.

17. The method of claim 1, further comprising introducing strain into the device structure to create the internal electric field that drives holes to a location of the device structure being etched.

* * * * *